United States Patent [19]

Gordon

[11] Patent Number: 4,786,132
[45] Date of Patent: Nov. 22, 1988

[54] HYBRID DISTRIBUTED BRAGG REFLECTOR LASER

[75] Inventor: Eugene I. Gordon, Convent Station, N.J.

[73] Assignee: Lytel Corporation, Sommerville, N.J.

[21] Appl. No.: 33,026

[22] Filed: Mar. 31, 1987

[51] Int. Cl.$^4$ ............................................... G02B 6/34
[52] U.S. Cl. .................................. 350/96.19; 372/20; 372/96
[58] Field of Search ................. 350/96.19; 372/20, 92, 372/96

[56] References Cited

U.S. PATENT DOCUMENTS

| | | | |
|---|---|---|---|
| 4,156,206 | 5/1979 | Comerford et al. | 350/96.19 X |
| 4,466,694 | 8/1984 | MacDonald | 350/96.19 |
| 4,704,720 | 11/1987 | Yamaguchi | 372/96 |

FOREIGN PATENT DOCUMENTS 0212815  3/1987  European Pat. Off. ......... 350/96.19

OTHER PUBLICATIONS

C. A. Park, et al. "Single-Mode Behavior, etc.", Electronics Letters, vol. 22, No. 21 Oct. 1986.

*Primary Examiner*—John D. Lee
*Assistant Examiner*—Phan Heartney
*Attorney, Agent, or Firm*—Marmorek Guttman & Rubenstein

[57] ABSTRACT

A mechanism for achieving single frequency output in a semiconductor laser diode is disclosed. In accordance with the invention, a conventional laser diode having an anti-reflection coating on its output facet is coupled to a single mode fiber output pigtail having an anti-reflection coating on its input facet. The anti-reflection coatings suppress Fabry-Perot type feedback which would normally be effective for a large number of wavelengths. The fiber includes a built-in distributed Bragg reflector grating, which grating is located just beyond the output fiber input facet. The grating supplies feedback that is effective only over a narrow wavelength band approximating the wavelength spacing between the actual longitudinal modes of the structure so that the laser produces only a single frequency output.

14 Claims, 1 Drawing Sheet

HYBRID DISTRIBUTED BRAGG REFLECTOR LASER

FIELD OF THE INVENTION

The present invention relates to the achieving of a single frequency output from a semiconductor laser diode. The new structure provides an alternative to the distributed feedback laser, the commonly accepted approach to achieving single frequency output in a semiconductor laser diode.

BACKGROUND OF THE INVENTION

In general, the light emitted by a semiconductor diode comes from the recombination of electrons and holes as a result of the flow of charge through a forward biased P-N junction. At sufficiently high current density the junction exhibits optical gain. To achieve laser operation, the optical gain provided by the diode in the shape of a long narrow stripe must be combined with optical feedback. Usually, feedback is achieved by cleaving a pair of oppositely disposed end facets of the semiconductor crystal containing the P-N junction. The cleaved end facets are oriented perpendicular to the striped P-N junction which also serves as a waveguide. Reflections back into the waveguide from the cleaved end facets provide the regeneration required for laser operation. The laser output radiation is transmitted through one or both of the cleaved facets.

The cleaved crystal end facets in combination with the waveguide along the junction define a conventional Fabry-Perot waveguide cavity resonator. With respect to the waveguide cavity resonator, "longitudinal" designates the direction of propagation along the waveguide and "lateral" and "transverse" designate the two directions perpendicular to the direction of the waveguide axis. An important aspect of semiconductor laser diode design is to reduce the number of lateral and transverse cavity modes so that the laser output is spatially coherent and capable of diffraction-limited collimation and to reduce the number of longitudinal cavity modes so that the output radiation is as monochromatic as possible. When there is only one longitudinal cavity mode the output is substantially a single frequency, that is, the entire output is within a very narrow frequency band.

The most common type of laser diode structure is known as the double heterostructure. The double heterostructure may be utilized to produce a collimated spatially coherent output beam. Typically the double heterostructure is formed from a ternary or quaternary material such as AlGaAs or GaInAsP. The double heterostructure laser comprises a narrow bandgap, optically active thin layer (0.1–0.2 micron thick) which is sandwiched between a pair of thicker, wider bandgap cladding layers. The index of refraction and the band structure change abruptly at the interfaces between the active layer and the cladding layers. The cladding layers serve to confine charge carriers to the active layer and, because they have a lower index of refraction, provide fundamental mode waveguiding in the transverse direction for radiation propagating in the plane of the active layer. Fundamental mode waveguiding in the lateral direction may be achieved by defining a relatively narrow stripe-shaped active region, which stripe-shaped active region is also bound laterally by wide bandgap material as in the cladding layers. This type of structure is commonly referred to as "index-guided". The width of the active layer stripe is about 1.5 microns in order to achieve fundamental lateral mode guiding. This dimension depends on the thickness. An example of a laser diode having a narrow stripe-shaped index-guided active region is the double channel buried heterostructure. When the waveguide has sufficiently small dimensions in the transverse and lateral directions, only the fundamental transverse mode and the fundamental lateral mode are supported and can oscillate so that a spatially coherent Output results.

In the typical double-heterostructure laser, the crystal end facets are cleaved to provide reflecting surfaces. As indicated above, the cleaved end facets define a Fabry-Perot cavity resonator for supplying feedback. Because of its length (typically 250 microns) the Fabry-Perot waveguide cavity can in principle support a large number of longitudinal modes. However, only those longitudinal modes within the wavelength band in which the semiconductor material has gain actually oscillate. Thus, a typical double heterostructure Fabry-Perot type laser oscillates in a significant but limited number of longitudinal modes.

In many applications only one longitudinal mode can be tolerated. One way to reduce the number of oscillating longitudinal modes is to provide some periodic structure that couples to the radiation field within or near and parallel to the active region. For example, one can construct a fundamental transverse mode and fundamental lateral mode waveguide laser diode with a periodic index of refraction perturbation grating incorporated adjacent to the waveguide. The grating with carefully chosen periodicity forms a distributed reflector that turns the waveguide itself into a wavelength sensitive resonator which supplies feedback only over a very narrow wavelength band. The feedback is provided through periodic in-phase reflection from the grating elements. The reflections are in phase at only one wavelength. At other wavelengths the reflections cancel. This technique is known as distributed feedback. Deleterious broad bandwidth Fabry-Perot type feedback is suppressed by putting anti-reflection coatings on the crystal end facets of the laser. Since effective feedback is present for only a narrow wavelength band, and the possible longitudinal modes are spaced in wavelength as in the Fabry-Perot, the laser oscillates in only a single longitudinal mode and the laser output is substantially monochromatic. Another approach to achieving single frequency output from a semiconductor diode laser involves use of a narrow band-pass plane wave reflecting filter that is formed external to the semiconductor laser. Such an approach is described in N. K. Dutta, et al., "Single Longitudinal Mode Operation of a Semiconductor Laser Using a Metal Film Filter", *Journal of Quantum Electronics*, Vol. QE-21, No. 6, June 1985, pp 559.

The most common single frequency output laser diode is the distributed feedback laser described above. However, the distributed feedback laser exhibits chirping during current modulation and has a broad linewidth much greater than 1 Mhz. Thus, the distributed feedback laser is suitable only for use in incoherent, long fiber, high speed systems. In such systems, the single frequency output is not subject to partition noise of the type exhibited by multi-frequency Fabry-Perot type lasers. However, it cannot be used for coherent systems.

Laser diodes utilizing an external element for feedback generally have very narrow band output and exhibit minimal chirping because most of the energy stored in the cavity is outside the diode. Therefore, they can be used in coherent systems.

Accordingly, it is an object of the present invention to provide an alternative mechanism for achieving narrow band single frequency output with minimal or no chirp during current modulation from a semiconductor laser diode and more particularly, it is an object of the present invention to utilize a conventional Fabry-Perot type laser diode in a manner so as to achieve a single frequency output. This avoids development of a new laser diode structure.

SUMMARY OF THE INVENTION

The present invention is an alternative to the distributed feedback laser, the commonly accepted approach to achieving single frequency output in a semiconductor laser diode. The present invention utilizes a conventional, fundamental transverse mode and fundamental lateral mode waveguide Fabry-Perot type laser diode suitable for coupling into a single mode fiber or a slightly wider version that would oscillate in higher order lateral modes in normal operation and not couple well into a single mode fiber. The output facet of the laser is coated with an anti-reflection coating to achieve a relatively low reflectivity of one percent or less. The opposite facet is not changed. Such a device by itself would have a high threshold current for operation as a Fabry-Perot type laser and would exhibit multi-lateral mode and multi-longitudinal mode operation.

This laser is converted into a fundamental lateral mode device with a narrow band single frequency output by coupling to a single mode fiber with internal reflection. The single mode fiber has an anti-reflection coated input facet and narrow band reflectivity resulting from a distributed Bragg reflector grating built into the fiber in the region just beyond the input facet. The grating may be a few centimeters in length and preferably reflects about fifty percent of the light travelling in the core of the fiber. The exact percentage is not critical. The grating passes the remaining fifty percent of the light which constitutes the output power. At the wavelength at which the reflection is strong, the fiber is essentially lossless. The reflected light is coupled back into the laser fundamental mode and provides the necessary feedback for low threshold current operation. The feedback is effective only for the fundamental lateral mode of the laser (because the fiber is single mode) so coupling occurs only for the fundamental lateral mode of the laser waveguide. In addition, the feedback occurs only for one wavelength near the reflection peak of the grating. Thus, the laser only oscillates in the fundamental lateral mode and the laser output is substantially monochromatic. The large energy stored in the fiber increases the cavity quality factor and reduces the output linewidth.

The foregoing approach to single frequency output utilizes a conventional laser and requires no new laser chip development. It has qualities of ultra-low chirp, stability, and narrow line width that make it suitable for use in coherent as well as incoherent systems. In addition, as indicated below, the output frequency may be tuned electronically.

DETAILED DESCRIPTION OF THE INVENTION

Figure 1:
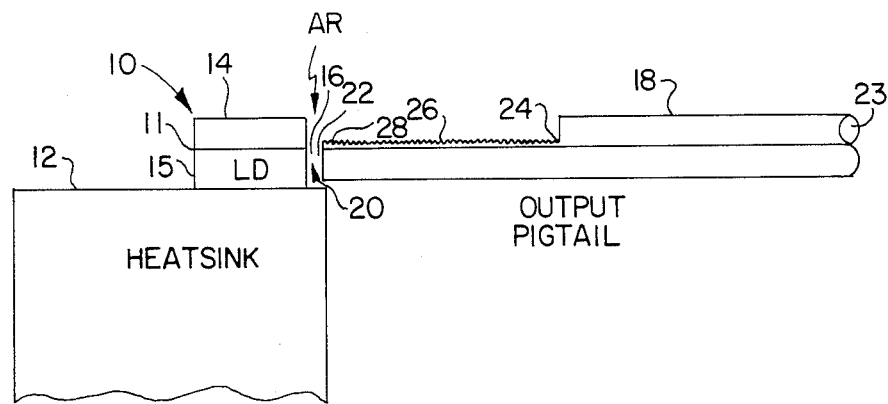
FIG. 1 schematically illustrates the achieving of a single frequency output from a laser diode in accordance with an illustrative embodiment of the invention.

Referring to FIG. 1, a semiconductor laser diode 10 capable of producing a substantially monochromatic output is illustrated. The laser 10 is mounted on a heat sink 12 and forward biased by means of lead 14. The laser 10 is a conventional Fabry-Perot type device. Illustratively, the laser 10 is a double-heterostructure device, for example, a double channel buried heterostructure. The backface mirror 15 is a conventional cleaved facet, perhaps with a coating to increase reflectivity. The output facet 16 has a good anti-reflection coating to achieve reflectivity on the order of one percent or less. As such, the device has a threshold current of at least twice that of a conventional non-anti-reflection coated Fabry-Perot type laser, but has a mode structure like that of a conventional Fabry-Perot type laser. As shown, the junction plane 11 is mounted away from the heat sink so that the fiber may be brought close.

A single mode optical fiber pigtail 18 is butt-coupled to the output facet 16 of the laser 10 with as small a gap 20 as possible. Thus, the gap 20 is desirably under 10 microns. The input facet 22 of the fiber is polished so that it is perpendicular to the longitudinal axis of the fiber and is coated with an anti-reflection coating. Beginning just beyond the input facet 22, the cladding 23 (see FIG. 2) of the fiber is polished down within a few microns of the fiber core to form a flat surface 24. A distributed Bragg reflector grating 26, with an appropriate period (about 0.4 microns) to reflect an incident wave at a predetermined wavelength is etched into the flat surface 24. The length of the reflector grating is a few centimeters. The total reflectivity of the grating can be made to approach 100% under ideal conditions depending on length of the grating, the depth of the grating and the spacing of the grating from the fiber core. However, in the present application, a reflectivity of about 50 percent is desirable. The non-reflected radiation becomes the optical output of the laser-fiber combination.

In the laser-fiber combination just described, there are two types of feedback. The undesirable type of feedback is the residual Fabry-Perot type feedback resulting from the cavity-like structure defined by the high reflectivity of the mirror-like back end facet 15 and the residual reflectivity of the anti-reflection coated output end facet 16 of the laser and/or the residual reflectivity of the anti-reflection coated input facet 22 of the fiber 18. The desirable type of feedback results from propagation in the fiber (which suppresses all but the lowest order mode) and the distributed Bragg reflector grating 26 incorporated into the fiber 18. The latter type of feedback is effective only for the fundamental lateral mode of the laser and only for one wavelength near the reflection peak of the grating. Thus in order for there to be a single frequency output, the feedback due to the reflectivity of the grating must dominate over the residual Fabry-Perot type feedback. By itself, the anti-reflection coated laser is a high threshold current device. The distributed grating incorporated into the fiber desirably provides sufficient feedback for low threshold current operation.

Viewed another way, the overall reflectivity of the laser output facet-optical fiber combination has several components. The undesirable component results from the residual reflectivity of the laser output facet and fiber input facet. With the use of anti-reflection coatings, the output facet of the laser 16 and the input facet 22 of the fiber 18 have residual reflectivities on the order of one percent. The desirable component of reflectivity of the laser output facet-optical fiber combination is determined by the grating. This reflectivity component is peaked at some wavelength $\lambda_0$ and has a distribution $R(\lambda)$ a few Angstroms wide. The magnitude is determined by the laser to fiber coupling coefficient C and the grating reflectivity $R_g(\lambda)$. In particular $R(\lambda) = C^2 R_g(\lambda)$. As indicated above $R_g$ is about 0.5. For a conventional commercially available fundamental lateral mode waveguided laser, C has a value of about 0.15 and $R(\lambda)$ has a value of about 0.01 or one percent. This is the same order of magnitude as the residual facet reflectivity.

It would be desirable to increase the coupling coefficient C so that the feedback caused by the grating dominates over Fabry-Perot type feedback. The value of the coupling coefficient, C, can be increased by increasing the width of the laser waveguide. Even though increasing the width of the laser waveguide would normally cause the laser to operate in higher order lateral modes, in this case the feedback resulting from the grating strongly favors the fundamental lateral mode since the fiber is a single mode optical fiber. If the laser waveguide is increased in width to optimize the coupling coefficient to the fiber, then the reflectivity and resulting feedback determined by the distributed Bragg reflector grating will dominate over the residual facet reflectivity and resulting Fabry-Perot type feedback. Thus, a single frequency fundamental lateral mode output will result. For example, if the coupling coefficient, C, is increased from 0.15 to about 0.387, $R(\lambda_0)$ will exceed the residual facet reflectivity by a factor of about seven. The higher reflectivity is achieved by increasing the width of laser stripe to a value that approximates the fundamental mode width of the fiber. This minimizes the mismatch between the laser spot size and the fiber spot size, which mismatch results in a reduced coupling coefficient.

In an alternative embodiment of the invention, the coupling coefficient between the laser and the fiber may be increased to about 0.3 by utilizing a fiber whose input end is tapered to form a lens. In this case, the laser is preferably a conventional fundamental lateral mode device, rather than the wider laser which is preferred for use in the embodiment of the invention shown in FIG. 1 and discussed above. Otherwise the coupling will be poor and lowest order lateral mode oscillation is not assured.

A proper evaluation of frequency selection in the laser diode-fiber pigtail combination requires a knowledge of the phase shift characteristics of both the laser waveguide and the fiber grating. However, enough insight to understand what happens can be achieved without detailed analysis. The total phase shift for light propagating in the laser diode-fiber pigtail combination has four components. These are:

1. the phase shift in the laser diode waveguide,
2. the phase shift in the air gap 20 between the diode output facet 16 and the fiber input facet 22,
3. the phase shift in the fiber region 28 between the fiber input facet 22 and the input end of the grating 26, and
4. the phase shift in the grating 26.

There is no dispersion in the air gap 20. All of the other component sections exhibit dispersion. However, as is shown below, the phase shift in the grating far exceeds the phase shift in all the other component sections.

The round trip phase shift for oscillation at wavelength, $\lambda_0$, with index of refraction, n, and path length, L, is $4\pi nL/\lambda_0$. It is appropriate to compare the optical path length nL for the four component sections identified above. For the laser with n=3.5 and L=250 microns, nL=875 microns. The gap 22 has nL=10 microns, the index of refraction of air being 1 and the gap having a width of, for example, 10 microns. The fiber section 28 in front of the grating has n=1.5 (for a quartz fiber) and L=100 microns so that nL=150 microns. The grating 26 has n=1.5 and L=2 centimeters so nL=$3\times10^4$ microns. Thus, the total optical path length is only a few percent greater than the optical path of the grating. Accordingly, it is reasonable to assume that the grating alone determines the optical path length for radiation propagating in the laser-fiber optical pigtail combination.

The oscillation condition requires that the total round trip phase shift equal a multiple of $2\pi$, or $$4\pi nL/\lambda = 2\pi m$$

where m is an integer or an integer plus $\frac{1}{2}$ depending on the phase shift upon reflection. The different values of m define the possible values of $\lambda$. The spacing between adjacent allowable possible oscillating wavelengths, the so called free spectral range, around the nominal wavelength $\lambda$ is $$\Delta\lambda = \lambda^2/2nL.$$

The full half-width of the reflection peak established by the grating is $$\delta\lambda/\lambda_0 = 1/N$$

where N is the number of grating periods and where $\lambda_o$ is the wavelength at the peak. This is a conventional formula applicable to any reflection grating. The grating period is $\lambda_0/2n$. The grating length is L. Thus, $$N = 2nL/\lambda_0,$$

$$\Delta\lambda = \lambda_0^2/2nL$$

Thus, the full half width of the reflection peak and the free spectral range are the same. Accordingly, there is only one longitudinal mode under the main portion of the reflection peak and this is the longitudinal mode in which the laser oscillates to produce a single frequency output. The only exception to this might be the rare case wherein two longitudinal modes precisely straddle the central wavelength of the reflection peak.

The laser diode fiber pigtail combination does not appear to be subject to mechanical instabilities. The wavelength of oscillation $\lambda_0$ is tuned by thermal variations in the length of the grating. However the index of refraction n changes very slowly with temperature in quartz, the material out of which most optical fibers are made. Hence, the grating period and the oscillating wavelength track any changes in the length of the fiber. Thus, there are not likely to be mode jumps with changes in temperature over a reasonably broad range of temperatures. The optical path in the air gag 20 is such a small fraction of the total optical path that its influence on the oscillating wave length will be negligible due to thermal or mechanical instability. In particular, a 10 micron gap cannot be expected to change significantly due to thermal expansion or vibration.

In short, by making the grating in a quartz fiber and with an optical path length large compared to any other optical path length, the influence of temperature is limited to tuning the oscillating wavelength by changing the length of the fiber. The fact that the grating is external to the laser diode does no compromise mechanical stability. In fact, in contrast to the conventional distributed feedback laser, the long grating on the a single mode quartz fiber has a much better frequency selectivity with greater stability and greater suppression of mode competition and chirping when the laser is current modulated.

Construction of the laser diode fiber pigtail combination poses no special problems. In particular, making a conventional waveguided laser diode, such as a double channel buried heterostructure laser diode, with a slightly wider stripe than that used to produce fundamental lateral mode output in normal operation produces no special problems.

The grating may be formed in the fiber by first soldering a metal coated fiber into a brass ferrule. The fiber input end is then polished to produce a flat input facet with no bevel. Since the fiber is firmly secured in the brass ferrule along its length, the side of the ferrule may be polished to expose the cladding, thus allowing the cladding to be removed along a flat surface almost to the fiber core. After this, the grating is etched using a known holographic technique. The period of the grating for $\lambda_0 = 1.3$ microns is roughly 0.44 microns. For comparison, note that the period of the grating utilized in a conventional distributed feedback laser is about 0.186 microns. Thus, the same holographic techniques that are used to form the grating in conventional distributed feedback lasers can be used to form the grating in the optical fiber in accordance with the present invention, but the task is less demanding. Alignment of the fiber to couple to the laser diode may be accomplished by way of a commercially known technique used in connection with conventional laser diodes.

For many applications it would be desirable to tune the output wavelength. In some cases, slow tuning over a broad wavelength range is desirable. In other cases, high speed frequency or phase modulation is desirable. To change the wave length at electronic speeds, it is necessary to change the phase velocity of the wave or the equivalent index of refraction experienced by the wave in the fiber. The oscillating wavelength is determined by the condition $$2(2\pi n_e/\lambda) = 2\pi/\Lambda$$

wherein $\Lambda$ is the grating period, $\lambda$ is the output wavelength, and $n_e$ is the equivalent index of refraction experienced by the wave in the fiber.

Thus $$\lambda = 2n_e\Lambda$$

For changes in wavelength, $\delta\lambda$, resulting from changes in $n_e$, $$\delta\lambda/\lambda = \delta n_e/n_e$$

To achieve a tuning range of $\delta\lambda/\lambda$ equal to 5%, the equivalent index of refraction $n_e$ experienced by the wave propagating in the fiber core must be varied by 5%.

Figure 2:
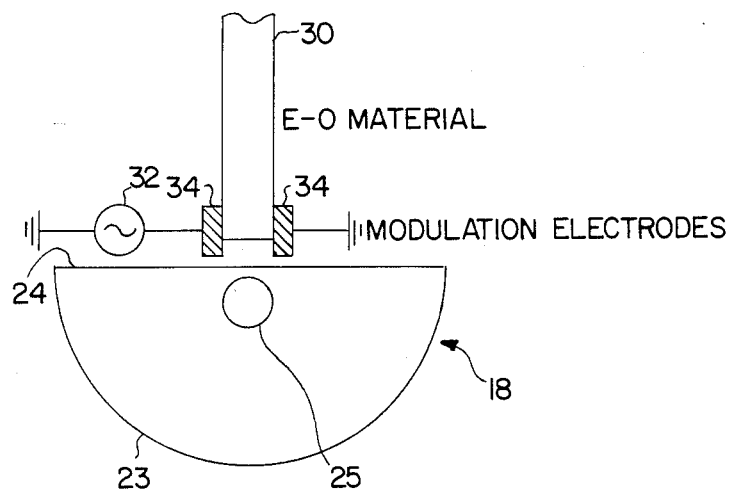
FIG. 2 schematically illustrates a mechanism for tuning the single frequency output produced by the laser diode of FIG. 1.

FIG. 2 schematically illustrates apparatus for varying the equivalent index of refraction experienced by the radiation field propagating in the fiber 18. Illustratively, an electro-optic material, such as lithium-niobate is used. The electro-optic material 30 has an electro-optic coefficient such that an electric field applied across its base changes its index of refraction. By virtue of the material 30 being located very near to the fiber core 25, changes in the index of refraction of the material 30 cause changes in the equivalent index of refraction $n_e$ experienced by the wave propagating in the fiber core. The precise modification depends on the index of refraction of the electro-optic material 30 and the voltage applied thereto. In other words, application of a controlled voltage to the electro-optic material 30 results in controlled changes in the phase velocity of waves propagating in the fiber. In FIG. 2, the electro-optic material is positioned on the surface 24 of the fiber, adjacent the fiber core. A voltage generator 32 is used to apply a variable voltage to the electro-optic material 30 by means of the electrodes 34.

In an alternative embodiment of the invention, the fiber may be etched to form a flat located near the fiber core. The grating may be etched in a separate quartz flat which is placed adjacent to the flat formed in the fiber. In this case, the orientation of the grating relative to the fiber can be varied by rotation of the quartz flat. The effective value of $\lambda_0$ can be increased by increasing the angle in the plane of the grating between the fiber core (i.e., the longitudinal axis of the fiber) and the normal to the grating lines in the plane of the grating. Thus a given grating will produce a minimum value $\lambda_0$ and can be tuned to larger values of $\lambda_0$ by rotation.

Finally the above described embodiments of the invention ar intended to be illustrative only. Numerous alternative embodiments may be devised without departing from the spirit or scope of the invention as set forth in the following claims.

I claim:

1. A combination comprising:
   a semiconductor laser diode including a front emission facet having an anti-reflection coating,
   an optical fiber coupled to said front emission facet of said laser diode to receive radiation emitted therein and to transmit at least a portion of the received radiation away from the laser diode, said transmitted radiation forming the output of said combination, and
   a periodic reflector grating formed adjacent the core of the fiber near the front emission facet of the laser diode to produce a substantially single wavelength output.

2. The combination of claim 1 wherein said optical fiber includes an input facet having an anti-reflection coating.

3. The combination of claim 2 wherein said fiber is coupled to said laser by butt coupling said anti-reflection coated input facet of said fiber to said anti-refection coated front emission facet of said laser diode.

4. The combination of claim 1 wherein said grating is formed on a flat of said fiber located adjacent the core of said fiber.

5. The combination of claim 1 wherein said laser diode is a waveguided laser diode and wherein said waveguide is wide enough so that in the absence of said fiber said laser would be capable of operating in higher order lateral modes.

6. The combination of claim 1 wherein said fiber is a single mode optical fiber and wherein said laser oscillates only in the fundamental lateral mode.

7. The combination of claim 1 wherein said combination includes means for tuning said single wavelength output of said laser diode.

8. The combination of claim 7 wherein said tuning means comprises an electro-optic material positioned adjacent the core of the optical fiber.

9. The combination of claim 8 wherein said tuning means further comprises means for applying a variable voltage to said electro-optic material.

10. The combination of claim 1 wherein said fiber includes a tapered lens at its end nearest the laser.

11. A combination capable of achieving single wavelength output from a semiconductor laser diode, said combination comprising:
- a Fabry-Perot type laser having an anti-reflector coated front emission facet,
- a single mode optical fiber coupled to said front emission facet of said laser, said fiber having an anti-reflection coated input facet, and
- a periodic reflection grating formed adjacent the core of said fiber and near the front emission facet of said laser for providing feedback at said wavelength, whereby said laser supports oscillations substantially only at said wavelength.

12. The combination of claim 11 wherein said laser is a waveguided laser sufficiently wide so as to support higher order lateral modes in the absence of said fiber.

13. The combination of claim 11 wherein said grating is formed in a flat surface located adjacent said fiber core.

14. The combination of claim 11 wherein said grating is rotatable relative to the longitudinal axis of said fiber.

* * * * *